(12) United States Patent
Yang et al.

(10) Patent No.: US 10,943,994 B2
(45) Date of Patent: Mar. 9, 2021

(54) MANUFACTURING METHOD FOR SHIELDED GATE TRENCH DEVICE

(71) Applicant: SHANGHAI HUAHONG GRACE SEMICONDUCTOR MANUFACTURING CORPORATION, Shanghai (CN)

(72) Inventors: Yulong Yang, Shanghai (CN); Zhengrong Chen, Shanghai (CN); Haofeng Shen, Shanghai (CN)

(73) Assignee: Shanhai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 16/705,701

(22) Filed: Dec. 6, 2019

(65) Prior Publication Data

US 2020/0295159 A1   Sep. 17, 2020

(30) Foreign Application Priority Data

Mar. 13, 2019  (CN) .......................... 201910188430.3

(51) Int. Cl.
    *H01L 29/66* (2006.01)
(52) U.S. Cl.
    CPC .............................. *H01L 29/66734* (2013.01)

(58) Field of Classification Search
    None
    See application file for complete search history.

(56) References Cited

U.S. PATENT DOCUMENTS

| 2008/0164522 | A1* | 7/2008 | Mikasa | ............ H01L 29/66795 |
| | | | | 257/345 |
| 2014/0256109 | A1* | 9/2014 | Yin | ..................... H01L 29/6659 |
| | | | | 438/300 |
| 2019/0103466 | A1* | 4/2019 | Yang | ................. H01L 29/66613 |
| 2020/0295159 | A1* | 9/2020 | Yang | ..................... H01L 29/407 |

* cited by examiner

*Primary Examiner* — Thien F Tran
(74) *Attorney, Agent, or Firm* — MKG, LLC

(57) ABSTRACT

A manufacturing method for a shielded gate trench device comprises the following steps: Step 1, forming a gate trench in a first epitaxial layer; Step 2, forming a first dielectric layer and fully filling the gate trench with a first polysilicon layer; Step 3, forming a top trench: Step 31, carrying out primary polysilicon dry-etching; Step 32, carrying out primary dielectric layer wet-etching to decrease the thickness of the first dielectric layer in the top trench; Step 33, carrying out secondary polysilicon dry-etching; Step 34, carrying out secondary dielectric layer wet-etching to remove the rest of the first dielectric layer on a side face of the top trench and to form the top trench; and Step 4, forming a trench gate in the top trench. By adoption of the manufacturing method, the gate-source capacitance and the gate-drain capacitance can be decreased, and thus, the input capacitance is decreased.

15 Claims, 12 Drawing Sheets

MANUFACTURING METHOD FOR SHIELDED GATE TRENCH DEVICE

CROSS REFERENCE TO RELATED APPLICATION

The present application claims priority to Chinese Patent Application No. 201910188430.3 filed on Mar. 13, 2019, the entirety of which is incorporated by reference herein.

TECHNICAL FIELD

The invention relates to a manufacturing method for a semiconductor integrated circuit, in particular to a manufacturing method for a shielded gate trench (SGT) device.

BACKGROUND OF THE INVENTION

FIG. 1A is a structure diagram of an existing shielded gate trench device, wherein one cell structure of the trench gate device is shown in FIG. 1A. For instance, as an N-type device, the existing shielded gate trench device 201 comprises:

an N-type epitaxial layer 102 formed on the surface of an N+ semiconductor substrate such as a silicon substrate 101, wherein a gate trench is formed in the N-type epitaxial layer 102, shielding polysilicon 103 and a gate conducting material layer 106 are formed in the gate trench, and the gate conducting material layer 106 is generally a polysilicon gate.

The shielding polysilicon 103 is isolated from an inner surface of the gate trench by a shielding dielectric layer 104, the polysilicon gate 106 is isolated from a side face of the gate trench by a gate dielectric layer 105, and the shielding polysilicon 103 is isolated from the polysilicon gate 106 by an inter-gate isolation dielectric layer 105a.

A body region 107 is formed on the surface of the N-type epitaxial layer 102, and a source region 108 is formed on the surface of the body region 107.

A drift region 102 is formed by the N-type epitaxial layer 102 at the bottom of the body region 107.

A drain region is formed after the silicon substrate 101 is thinned.

A contact hole 110 penetrating through an interlayer film 109 is formed in the top of the source region 108, and a source and a gate (not shown) are formed after a front metal layer 111 is patterned.

A drain is formed by a back metal layer 112.

FIG. 1B is a circuit diagram of the parasitic capacitance of the existing shielded gate trench device. As shown in FIG. 1B, the parasitic capacitance of the trench gate device 201 includes a gate-drain capacitance Cgd, a gate-source capacitance Cgs, and a drain-source capacitance Cds, wherein:

The gate-drain capacitance Cgd is mostly formed by overlapping of the polysilicon gate 106 and the drift region 102. As shown in FIG. 1A, the total gate-drain capacitance Cgd is formed by superposition of symmetric gate-drain capacitances Cgd1 and Cgd2 on two sides of the polysilicon gate 106.

The shielding polysilicon 103 is generally connected to the source, so that the gate-source capacitance Cgs mainly depends on an overlap area between the polysilicon gate 106 and the shielding polysilicon 103.

An input capacitance Ciss equals the sum of the gate-drain capacitance Cgd and the gate-source capacitance Cgs, wherein the gate-drain capacitance Cgd accounts for about 90% of the input capacitance Ciss. The input capacitance Ciss has a decisive effect on the switching delay time in such a manner that the switching rate increases with the decrease of the input capacitance Ciss, so that in order to increase the switching rate of the device, the input capacitance Ciss should be decreased, which means that the gate-drain capacitance Cgd and the gate-source capacitance Cgs should be decreased.

FIGS. 2A-2I are device structure diagrams for all steps of an existing method. The manufacturing method for the existing shielded gate trench device comprises the following steps:

Step 1: providing a first epitaxial layer 301, and forming a gate trench 302 in a gate formation area of the first epitaxial layer 301 by etching and an etching area defined by lithography, as shown in FIG. 2A;

Step 2: forming a first dielectric layer 303 on a bottom surface and side wall surface of the gate trench 302, as shown in FIG. 2A, wherein the first dielectric layer 303 extends to an outer surface of the gate trench 302;

Generally, the first dielectric layer 303 is an oxide layer;

The gate trench 302 formed with the first dielectric layer 303 is fully filled with a first polysilicon layer 304, and the surface of the first polysilicon layer 304 is flush with the surface of the first dielectric layer 303 outside the gate trench 302;

Step 3: etching the first polysilicon layer 304 and the first dielectric layer 303 at the top of the gate trench 302 to form a top trench 306, by performing the following steps:

Step 31: carrying out primary polysilicon dry-etching to form an opening marked as 306a, as shown in FIG. 2B;

According to the existing method, the primary polysilicon dry-etching is generally anisotropic etching, so that the width of the opening 306a is identical with that of the finally-formed top trench 306, and the depth of the opening 306a is smaller than that of the top trench 306;

Step 32: carrying out secondary polysilicon dry-etching, and using the first polysilicon layer 304 subjected to the secondary polysilicon dry-etching as shielding polysilicon 304, as shown in FIG. 2C, wherein the top surface of the shielding polysilicon 304 is as large as the bottom surface of the top trench 306 to be formed;

Generally, the secondary polysilicon dry-etching is isotropic etching, so that an opening 306a is expanded into an opening 306b after the secondary polysilicon dry-etching;

Step 33:

carrying out dielectric layer wet-etching to remove the rest of the first dielectric layer 303 corresponding to the side face of the top trench 306 and to form the top trench 306, and using the first dielectric layer 303 subjected to the dielectric layer wet-etching as a shielding dielectric layer 303, as shown in FIG. 2D, wherein the top surface of the shielding dielectric layer 303 is lower than the top surface of the shielding polysilicon 304, as shown by dashed box 306c in FIG. 2D;

Step 4: forming a trench gate in the top trench 306, by performing the following steps:

Step 41: forming a gate dielectric layer 307 and an inter-gate dielectric layer 307a, as shown in FIG. 2F, wherein the gate dielectric layer 307 is located on the side face of the top trench 306, and the inter-gate dielectric layer 307a covers the side face and top surface of the shielding polysilicon 304 located over the top surface of the shielding dielectric layer 303;

Generally, the gate dielectric layer 307 is an oxide layer, and the inter-gate dielectric layer 307a is an oxide layer;

The gate dielectric layer 307 and the inter-gate dielectric layer 307a are synchronously formed by the same thermal oxidation process;

Step 42: filling the top trench 306 with a gate conducting material layer 308, and superimposing the gate conducting material layer 308 on the gate dielectric layer 307 to form the trench gate, as shown in FIG. 2G, wherein the inter-gate dielectric layer 307a is used for isolating the gate conducting material layer 308 from the shielding polysilicon 304;

The gate conducting material layer 308 is a polysilicon gate formed by a second polysilicon layer;

The polysilicon gate 308 is formed by performing the following steps:

Forming the second polysilicon layer 308 by deposition, as shown in FIG. 2G, wherein the top trench 306 is fully filled with the second polysilicon layer 308 which extends to an outer surface of the top trench 306;

Carrying out polysilicon back-etching to entirely remove the second polysilicon layer 308 on the outer surface of the top trench 306, and using the second polysilicon layer 308 left in the top trench 306 as the polysilicon gate 308;

Generally, the gate trench 302 formed in Step 1 is located in a device region of the trench gate device, and a source lead-out region is located outside the device region.

A source lead-out trench 302a is formed in the source lead-out region, as shown in FIG. 2A, wherein the source lead-out trench 302a and the gate trench 302 are synchronously formed by the same process, and the source lead-out trench 302a is communicated with the gate trench 302.

In Step 2, the first dielectric layer 303 and the first polysilicon layer 304 are also synchronously formed in the source lead-out trench 302a.

In Step 3, a first photoresist pattern 305 is defined by lithography, before the top trench 306 is formed, wherein the first photoresist pattern 305 opens the device region, covers the source lead-out region and is removed after the top trench 306 is formed and before Step 4 is performed, as shown in FIG. 2E.

The trench gate device comprises a plurality of device cell structures which are periodically arrayed in the device region. A plurality of gate trenches 302 are formed in Step 1, and each gate trench corresponds to one device cell structure.

The lightly-doped first epitaxial layer 301 provided in Step 1 is of a first conductivity type, is formed in a drift region of the trench gate device, and is located on the surface of a heavily-doped semiconductor substrate of the first conductivity type.

The semiconductor substrate is a silicon substrate, and the first epitaxial layer 301 is a silicon epitaxial layer.

The manufacturing method further comprises the following steps to be performed after Step 4:

Forming a well region 309 of a second conductivity type in the first epitaxial layer 301, as shown in FIG. 2I, wherein the trench gate penetrates through the well region 309, and the trench gate covers a side face of the well region 309 and forms a channel on the side face of the well region 309;

Carrying out first conductivity-type heavily-doped implantation to form a source region on the surface of the well region 309 of the second conductivity type;

Forming an interlayer film on the front side of the semiconductor substrate;

Forming, by etching and an etching area defined by lithography, contact holes penetrating through the interlayer film, wherein the contact holes are correspondingly formed in the top of the first polysilicon layer 304 located in the source region, the trench gate and the source lead-out trench 302a;

Forming a front metal layer, and patterning the front metal layer to form a source and a gate, wherein the source is connected with the source region at the bottom of the source via the corresponding contact hole, the gate is connected with the polysilicon gate at the bottom of the gate via the corresponding contact hole, the source is also connected with the first polysilicon layer 304 in the source lead-out trench 302a at the bottom of the source via the corresponding contact hole, and the shielding polysilicon 304 is connected to the source via the first polysilicon layer 304 in the source lead-out trench 302a.

The trench gate device is a trench gate MOSFET, and the manufacturing method further comprises the following steps:

Thinning the semiconductor substrate from the back side;

Forming a first conductivity-type heavily-doped drain region on the back side of the thinned semiconductor substrate;

Forming a back metal layer on the back side of the drain region, and forming a drain by the back metal layer.

As shown in FIG. 2I, the height of an area covered by the side face of the microcomputer polysilicon gate 308 is d101, a gate-drain overlap area having a height of d102 is formed between the bottom of the well region 309 and the bottom surface of the polysilicon gate 308, and a gate-source overlap area having a height of d103 is formed between the top surface of the shielding polysilicon 304 and the bottom surface of the polysilicon gate 308.

BRIEF SUMMARY OF THE INVENTION

The technical issue to be settled by the invention is to provide a manufacturing method for a shielded gate trench device, for the purpose of decreasing the gate-source capacitance and the gate-drain capacitance so as to decrease the input capacitance.

To settle the above technical issue, the manufacturing method for a shielded gate trench device comprises the following steps:

Step 1: providing a first epitaxial layer, and forming a gate trench in a gate formation area of the first epitaxial layer by etching and an etching area defined by lithography;

Step 2: forming a first dielectric layer on a bottom surface and a side wall surface of the gate trench, wherein the first dielectric layer extends to an outer surface of the gate trench;

Fully filling the gate trench, formed with the first dielectric layer, with a first polysilicon layer, wherein the surface of the first polysilicon layer is flush with the surface of the first dielectric layer located outside the gate trench;

Step 3: etching the first polysilicon layer and the first dielectric layer at the top of the gate trench to form a top trench, by performing the following steps:

Step 31: carrying out primary polysilicon dry-etching, wherein after the primary polysilicon dry-etching, the top surface of the first polysilicon layer is higher than the bottom surface of the top trench to be formed;

Step 32: carrying out primary dielectric layer wet-etching to decrease the thickness of the first dielectric layer corresponding to the side face of the top trench;

Step 33: carrying out secondary polysilicon dry-etching, and using the first polysilicon layer subjected to the secondary polysilicon dry-etching as shielding polysilicon, wherein the top surface of the shielding polysilicon is as large as the bottom surface of the top trench to be formed;

Step 34: carrying out secondary dielectric layer wet-etching to remove the rest of the first dielectric layer corresponding to the side face of the top trench, and using the first dielectric layer subjected to the secondary dielectric layer wet-etching as a shielding dielectric layer, wherein the top surface of the shielding dielectric layer is lower than the top surface of the shielding polysilicon; before the completion of the secondary polysilicon dry-etching, the thickness of the rest of the first dielectric layer corresponding to the side face of the top trench is decreased to shorten the time for the secondary dielectric layer wet-etching, so that a height difference between the top surface of the shielding dielectric layer and the top surface of the shielding polysilicon is reduced; and Step 4: forming a trench gate in the top trench.

Furthermore, the first dielectric layer is an oxide layer.

Furthermore, the primary polysilicon dry-etching is isotropic etching, which is carried out to further decrease the thickness of the rest of the first dielectric layer corresponding to the side face of the top trench before Step 34 is performed.

Furthermore, the secondary polysilicon dry-etching is isotropic etching, which is carried out to further decrease the thickness of the rest of the first dielectric layer corresponding to the side face of the top trench before Step 34 is performed.

Furthermore, Step 4 comprises the following steps:

Step 41: forming a dielectric layer and an inter-gate dielectric layer, wherein the gate dielectric layer is located on the side face of the top trench, and the inter-gate dielectric layer covers the side face and top surface of the shielding polysilicon located over the top surface of the shielding dielectric layer; and Step 42: filling the top trench with a gate conducting material layer, and superimposing the gate conducting material layer on the gate dielectric layer to form the trench gate, wherein the inter-gate dielectric layer is used for isolating the gate conducting material layer from the shielding polysilicon.

Furthermore, the gate dielectric layer is an oxide layer and is formed by a thermal oxidization process.

Furthermore, the inter-gate dielectric layer is an oxide layer.

Furthermore, the gate dielectric layer and the inter-gate dielectric layer are synchronously formed by the same thermal oxidization process.

Furthermore, the gate conducting material layer is a polysilicon gate formed by a second polysilicon layer.

Furthermore, the gate trench formed in Step 1 is located in a device region of the trench gate device, and a source lead-out region is located outside the device region;

A source lead-out trench is formed in the source lead-out region, the source lead-out trench and the gate trench are synchronously formed by the same process, and the source lead-out trench is communicated with the gate trench;

In Step 2, the first dielectric layer and the first polysilicon layer are also synchronously formed in the source lead-out trench;

In Step 3, a first photoresist pattern is defined by lithography before the top trench is formed, wherein first photoresist pattern opens the device region, closes the source lead-out region and is removed after the top trench is formed and before Step 4 is performed.

Furthermore, the trench gate device comprises a plurality of device cell structures which are periodically arrayed in the device region; and a plurality of gate trenches are formed in Step 1, and each gate trench corresponds to one device cell structure.

Furthermore, the lightly-doped first epitaxial layer provided in Step 1 is of a first conductivity type, is formed in a drift region of the trench gate device, and is located on the surface of a heavily-doped semiconductor substrate of the first conductivity type.

Furthermore, the semiconductor substrate is a silicon substrate, and the first epitaxial layer is a silicon epitaxial layer.

Furthermore, the manufacturing method further comprises the following steps to be performed after Step 4:

Forming a well region of a second conductivity type in the first epitaxial layer, wherein the trench gate penetrates through the well region, covers a side face of the well region, and forms a channel on the side face of the well region;

Carrying out first conductivity-type heavily-doped implantation to form a source region on the surface of the well region of the second conductivity type;

Forming an interlayer film on the front side of the semiconductor substrate;

Forming contact holes penetrating through the interlayer film by etching and an etching area defined by lithography, wherein the contact holes are correspondingly formed in the top of the first polysilicon layer located in the source region, the trench gate and the source lead-out trench; and Forming a front metal layer, and patterning the front metal layer to form a source and a gate, wherein the source is connected with the source region at the bottom of the source via the corresponding contact holes, the gate is connected with the polysilicon gate at the bottom of the gate via the corresponding contact hole, the source is also connected with the first polysilicon layer in the source lead-out region at the bottom of the source via the corresponding contact hole, and the shielding polysilicon is connected to the source via the first polysilicon layer in the source lead-out trench.

Furthermore, the trench gate device is a trench gate MOSFET, and the manufacturing method further comprises the following steps:

Thinning the semiconductor substrate from the back side;

Forming a heavily-doped drain region of the first conductivity type on the back side of the thinned semiconductor substrate; and Forming a back metal layer on the back side of the drain region, and forming a drain by the back metal layer.

According to the manufacturing method for the shielded gate trench device, after the gate trench is fully filled with the first dielectric layer and the first polysilicon layer, the first polysilicon layer is etched step by step in the process of forming the top trench corresponding to the trench gate by etching, and wet etching of the first dielectric layer is carried out between the two times of polysilicon dry-etching, so that the thickness of the rest of the first dielectric layer corresponding to the side face of the top trench is decreased before the completion of secondary polysilicon dry-etching, the time for the secondary dielectric layer wet-etching for completely removing the first dielectric layer is shortened, and the height difference between the top surface of the shielding dielectric layer and the top surface of the shielding polysilicon is decreased. In this way, the gate-source overlap area and the gate-drain overlap area are reduced, the gate-source capacitance and the gate-drain capacitance are decreased to decrease the input capacitance, and accordingly, the switching delay time of the device is shortened, and the switching rate is increased.

BRIEF DESCRIPTION OF THE DRAWINGS

The invention is further expounded below with reference to accompanying drawings and embodiments.

DETAILED DESCRIPTION OF PREFERRED EMBODIMENTS OF THE INVENTION

Figure 1A:
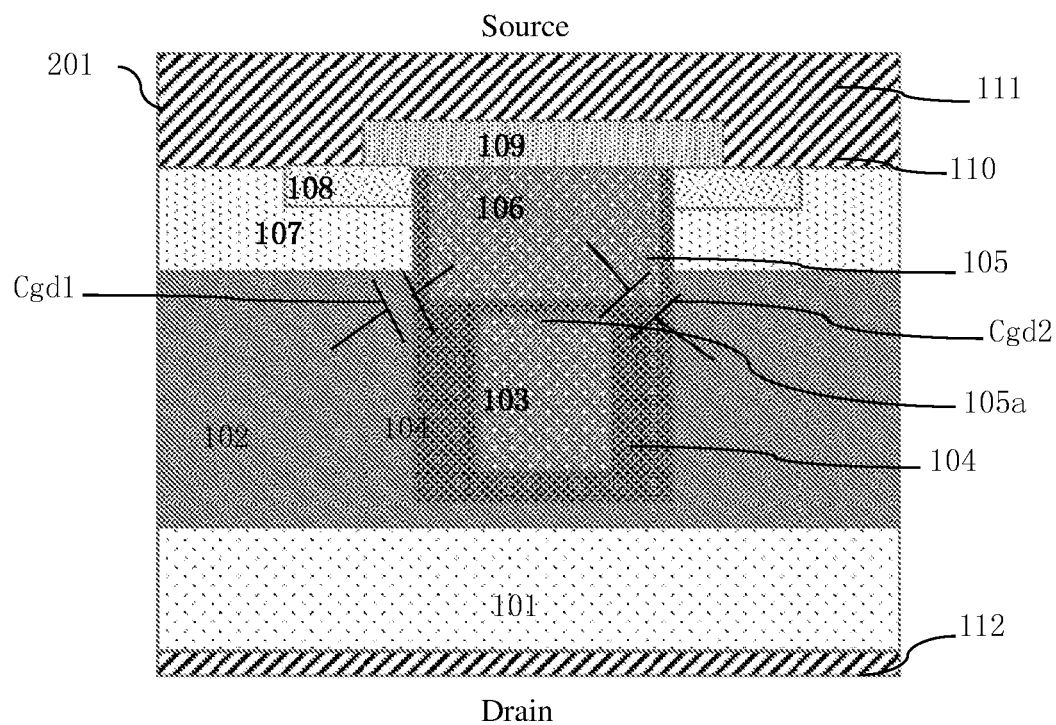
FIG. 1A is a structure diagram of an existing shielded gate trench device.
Figure 1B:
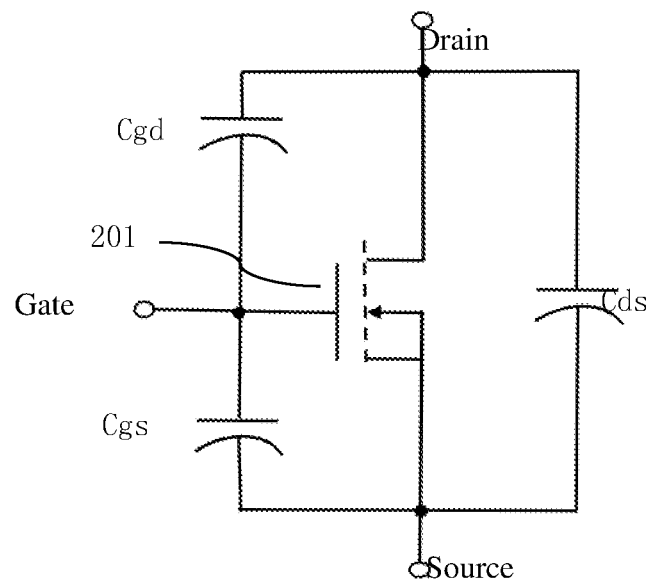
FIG. 1B is a circuit diagram of the parasitic capacitance of the existing trench gate having a shielded gate in FIG. 1.
Figure 2A:
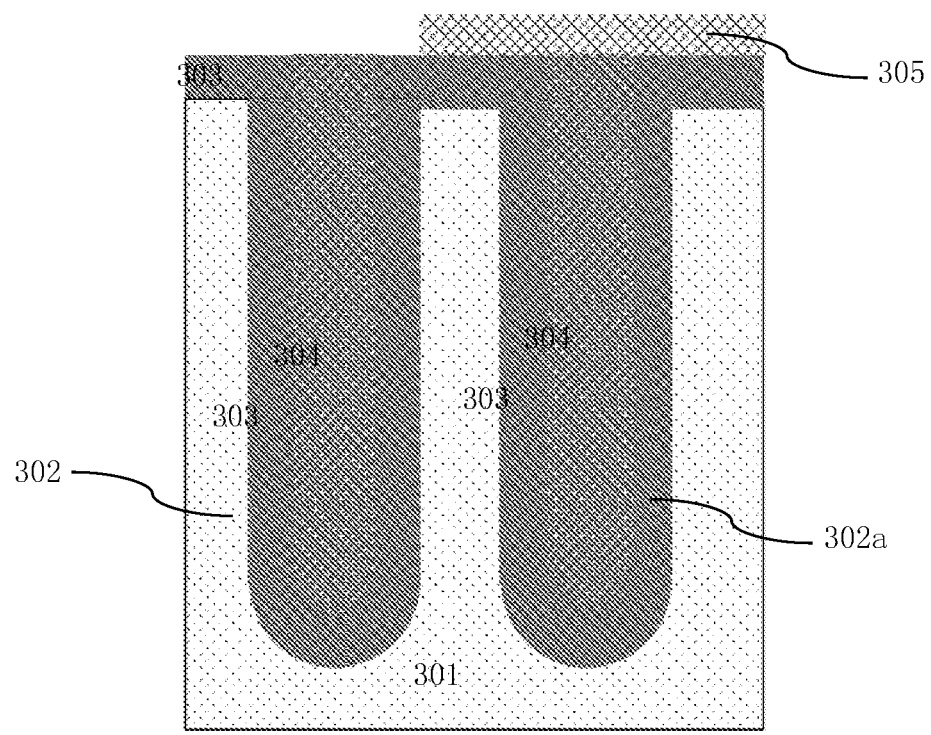
FIGS. 2A-2I are device structure diagrams for all steps of a manufacturing method for the existing shielded gate trench device.
Figure 2B:
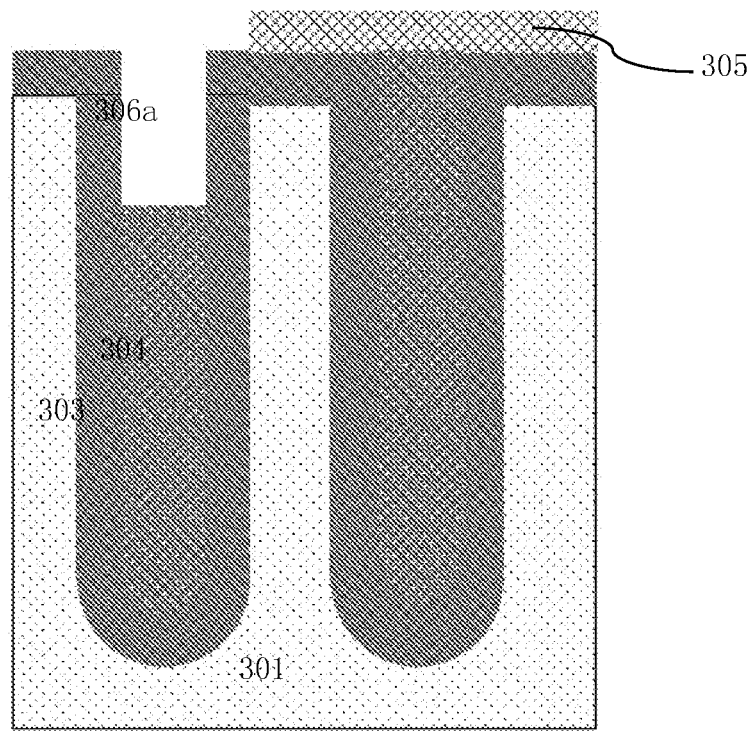
Figure 2C:
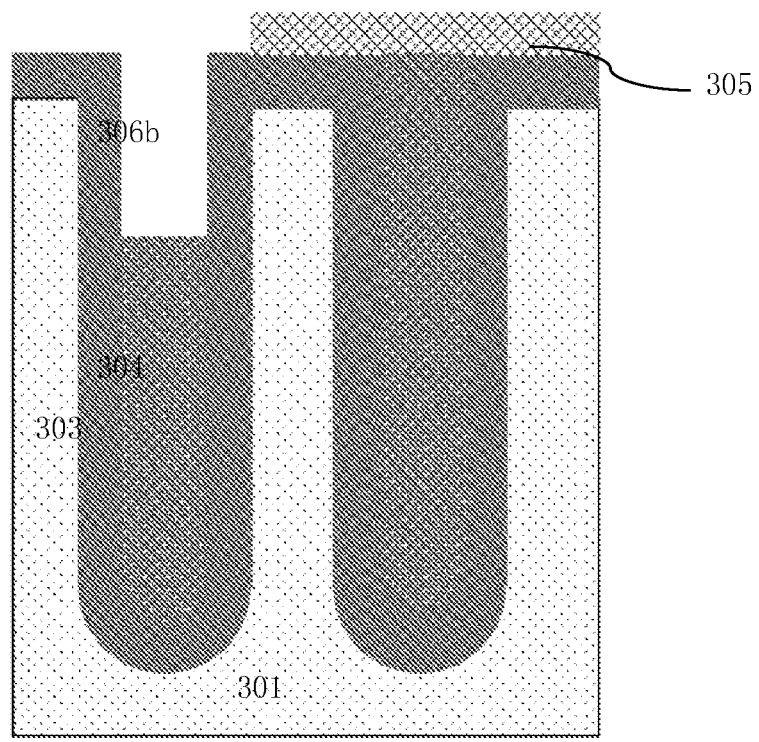
Figure 2D:
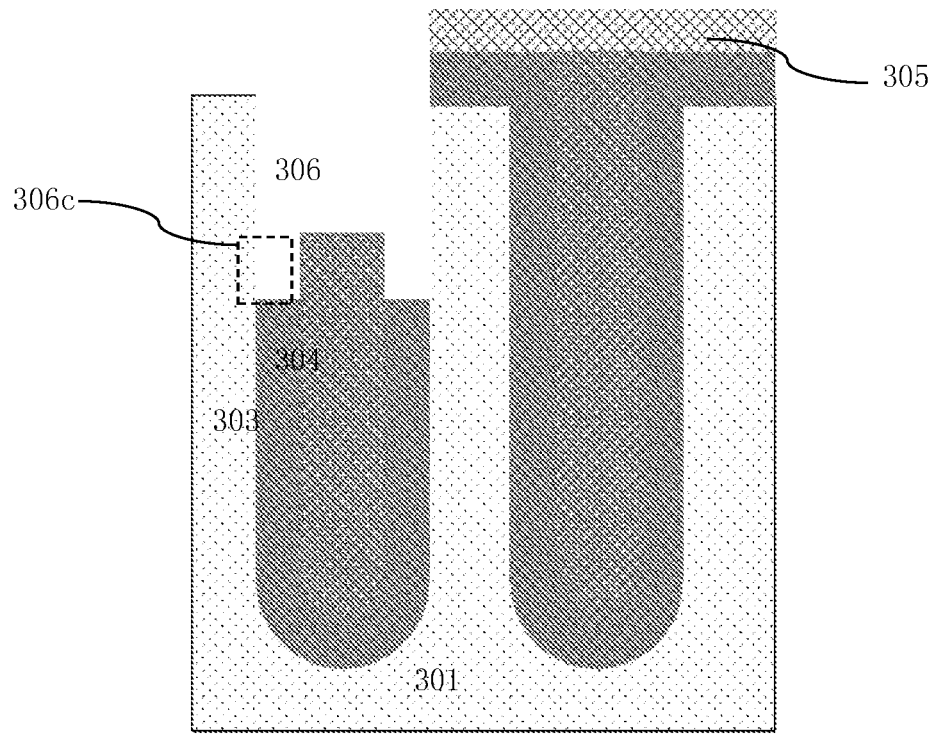
Figure 2E:
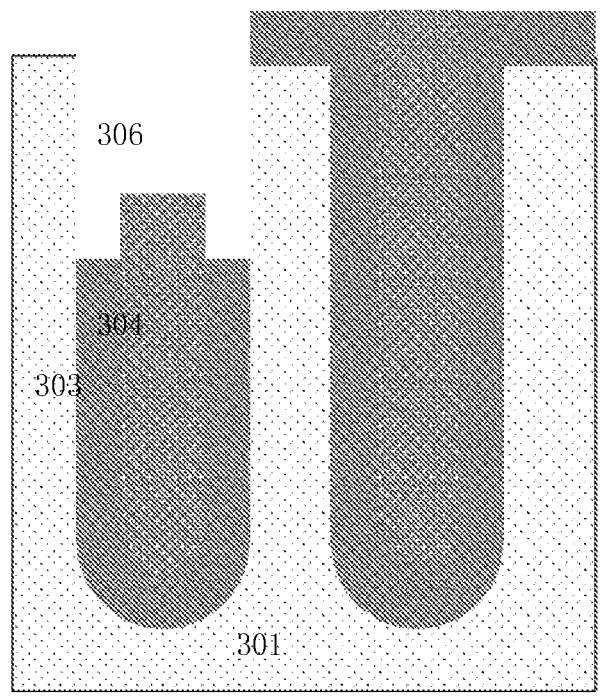
Figure 2F:
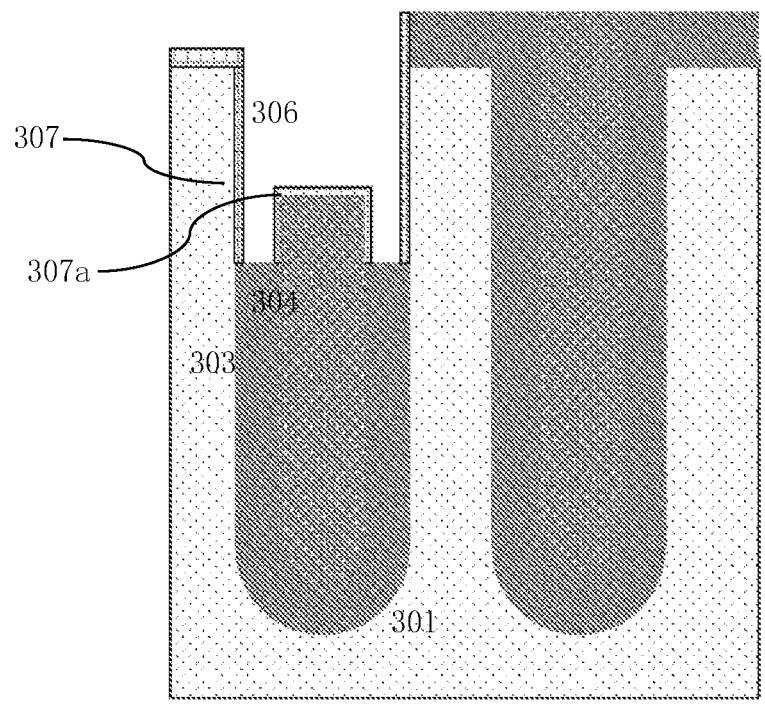
Figure 2G:
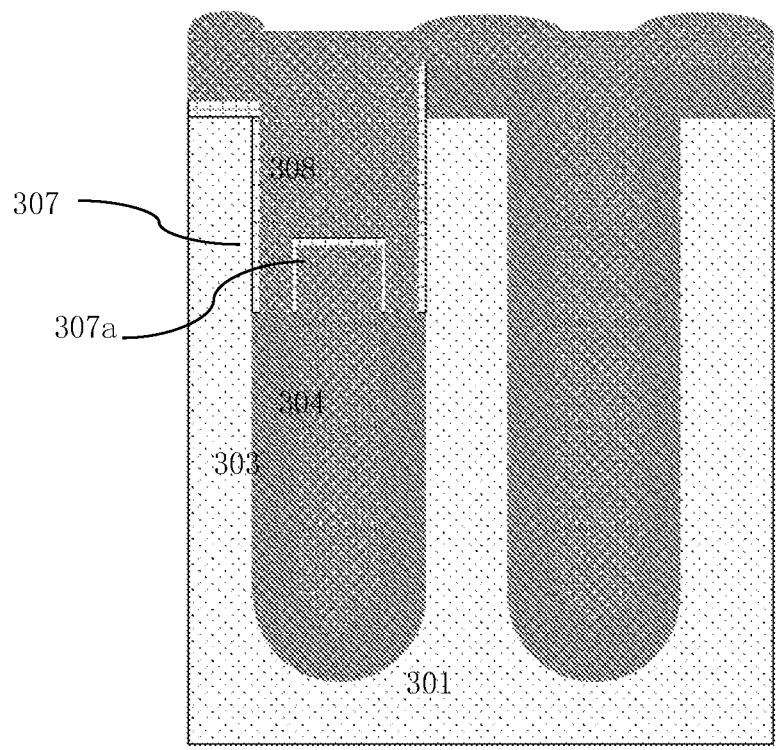
Figure 2H:
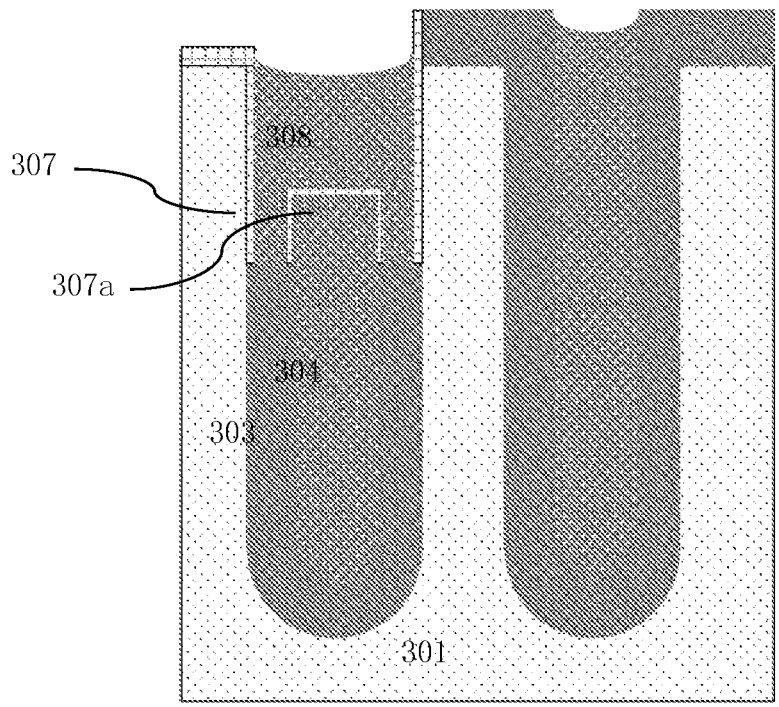
Figure 2I:
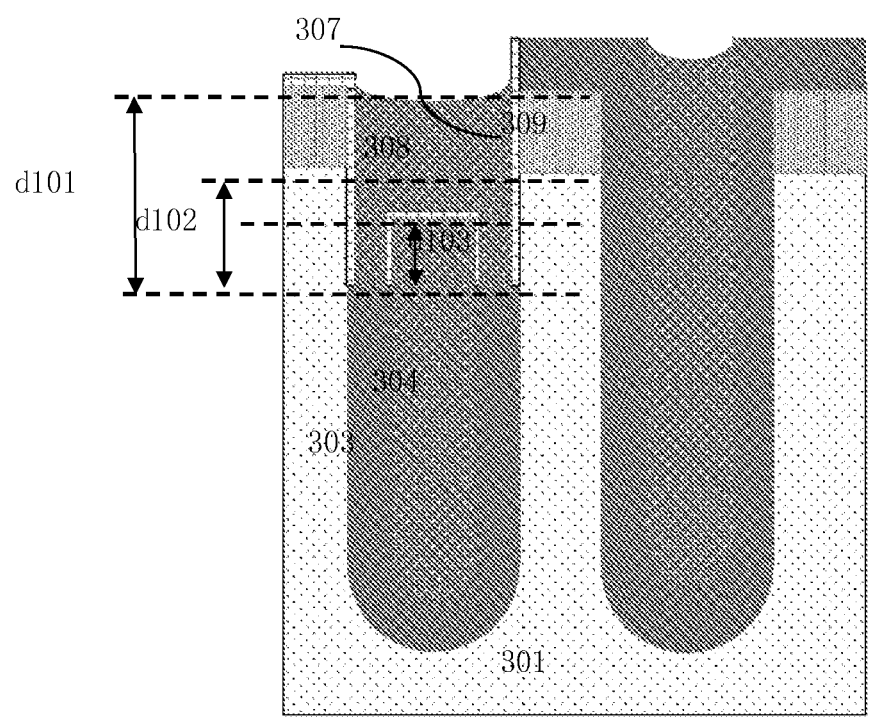
Figure 3:
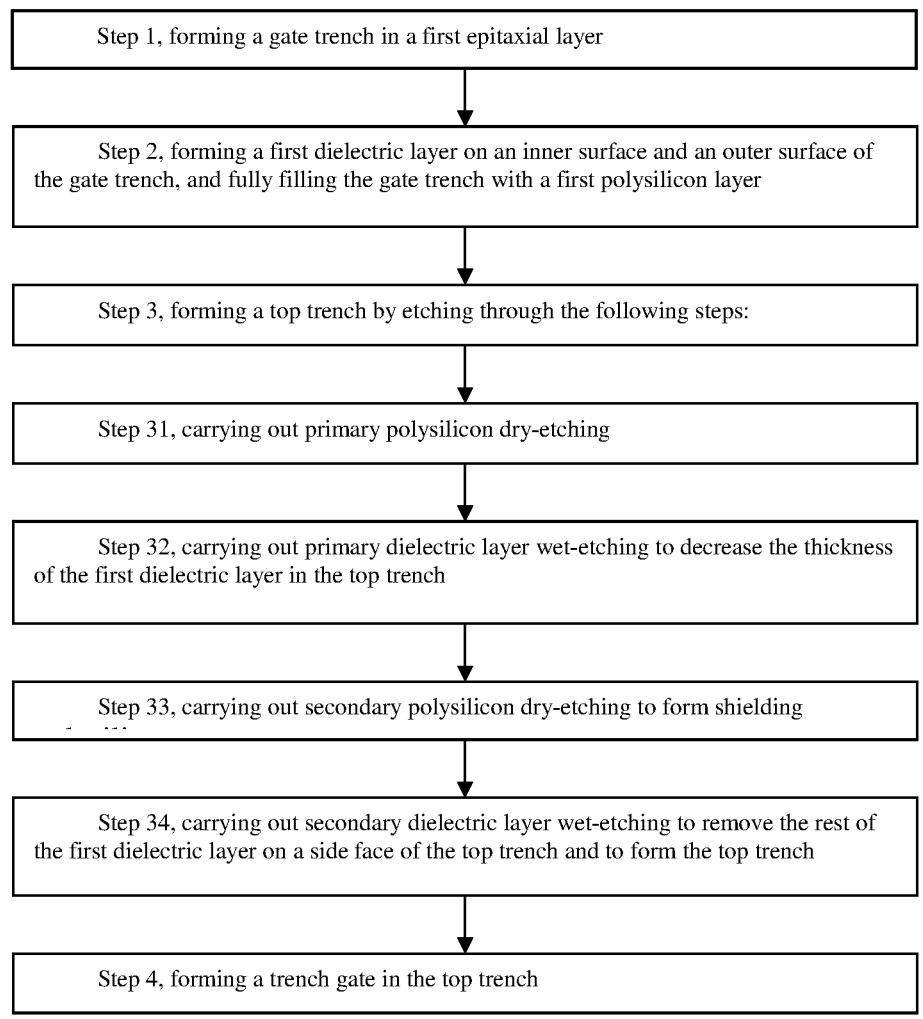
FIG. 3 is a flow diagram of a manufacturing method for a shielded gate trench device in an embodiment of the invention.
Figure 4A:
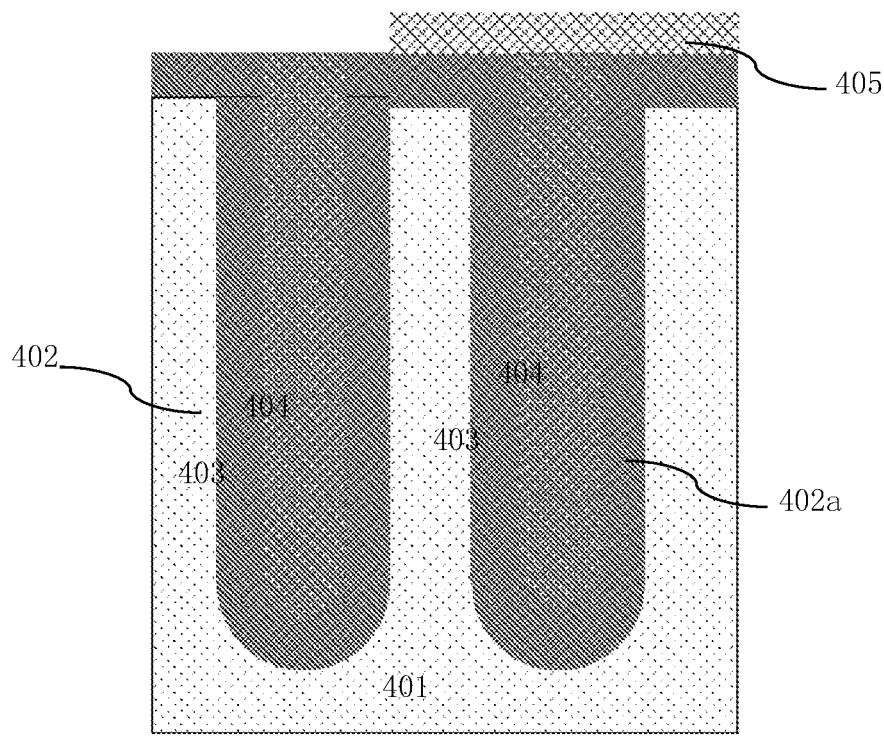
FIGS. 4A-4J are device structure diagrams for all steps of the manufacturing method in the embodiment of the invention.
Figure 4B:
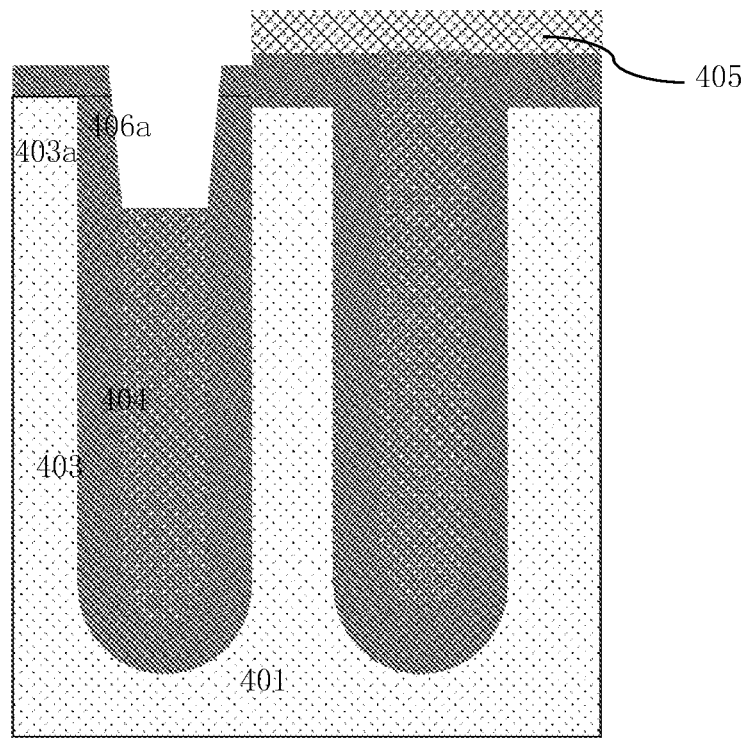
Figure 4C:
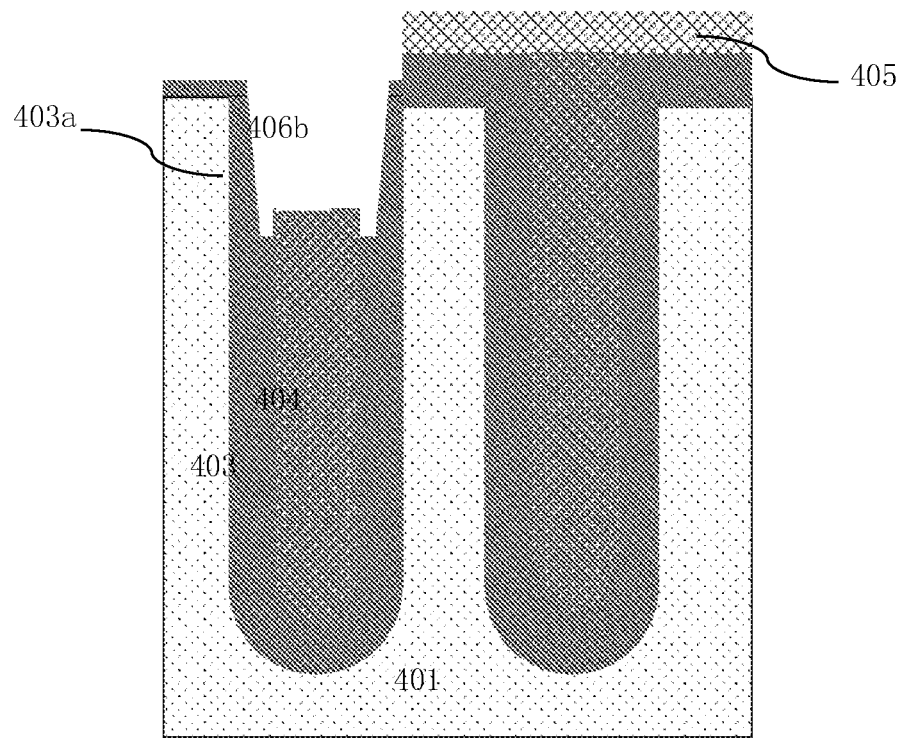
Figure 4D:
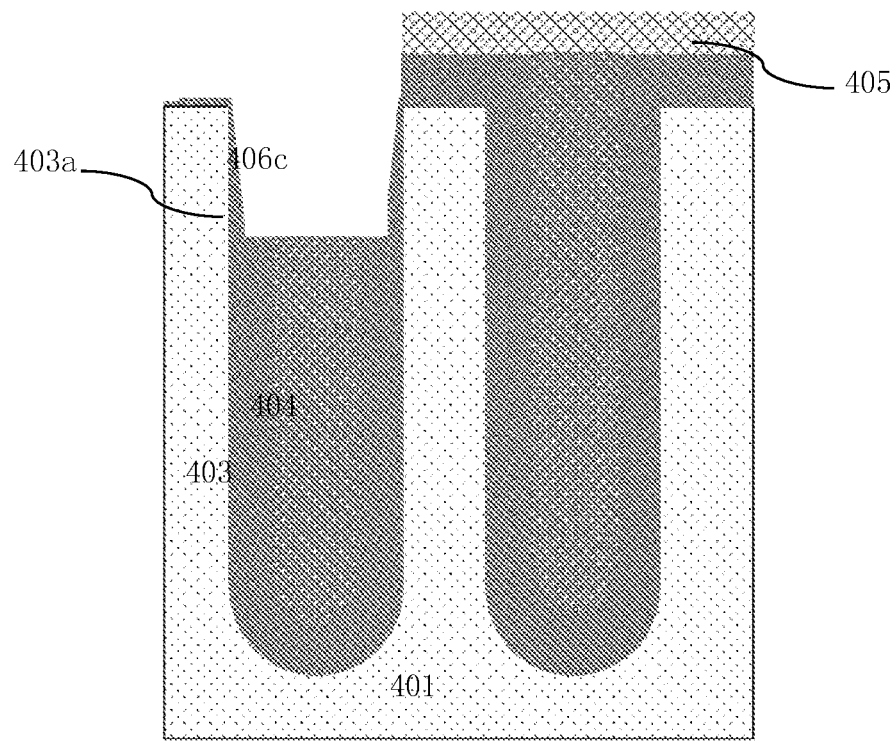
Figure 4E:
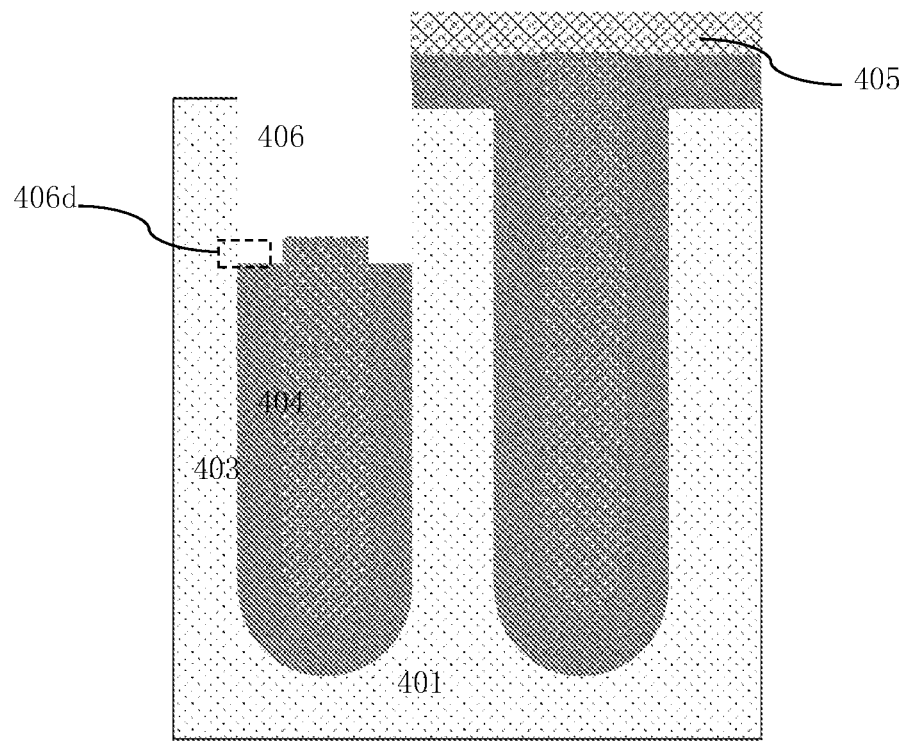
Figure 4F:
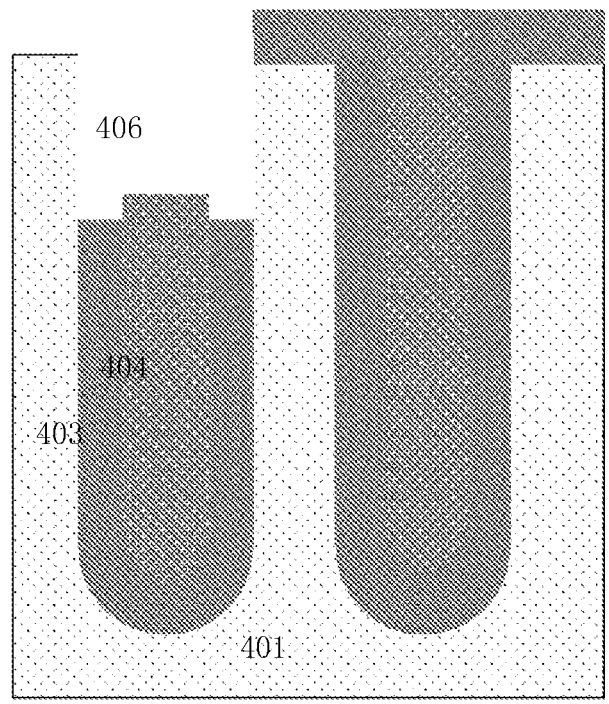
Figure 4G:
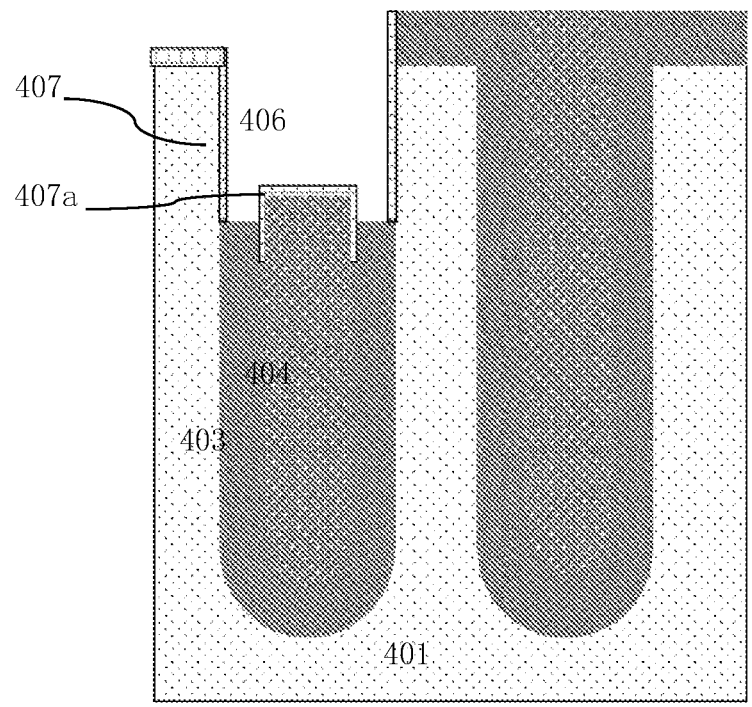
Figure 4H:
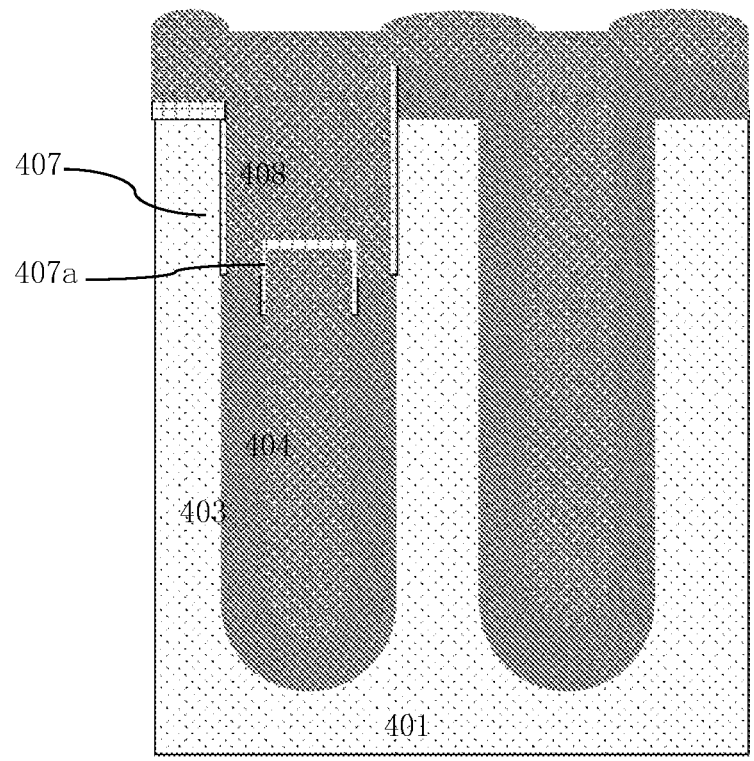

FIG. 3 is a flow diagram of a manufacturing method for a shielded gate trench device in one embodiment of the invention, and FIGS. 4A-4J are device structure diagrams for all steps of the manufacturing method in this embodiment. As shown in FIG. 3 and FIGS. 4A-4J, the manufacturing method for the shielded gate trench device comprises the following steps:

Step 1: as shown in FIG. 4A, a first epitaxial layer 401 is provided, and a gate trench 402 is formed in a gate formation area of the first epitaxial layer 401 by etching and an etching area defined by lithography;

Step 2: as shown in FIG. 4A, a first dielectric layer 403 is formed on a bottom surface and a side wall surface of the gate trench 402, wherein the first dielectric layer 403 extends to an outer surface of the gate trench 402 and is generally an oxide layer;

The gate trench 402 formed with the first dielectric layer 403 is fully filled with a first polysilicon layer 404, and the surface of the first polysilicon layer 404 is flush with the surface of the first dielectric layer 403 outside the gate trench 402;

Step 3: the first polysilicon layer 404 and the first dielectric layer 403 at the top of the gate trench 402 are etched to form a top trench 406 through the following steps:

Step 31: as shown in FIG. 4B, primary polysilicon dry-etching is carried out to form an opening marked as 406a, wherein the width and the depth of the opening 406a are smaller than those of the finally-formed top trench, a part, corresponding to the side face of the top trench 406, of the first dielectric layer 403 is marked as 403a, and after the primary polysilicon dry-etching, the top surface of the first polysilicon layer 404 is higher than the bottom surface of the top trench 406 to be formed;

The primary polysilicon dry-etching is isotropic etching and has a certain etching effect on the first dielectric layer 403, and the thickness of the rest of the first dielectric layer 403a corresponding to the side face of the top trench 406 is reduced by means of isotropic etching before Step 34;

Step 32: as shown in FIG. 4C, primary dielectric layer wet-etching is carried out to decrease the thickness of the first dielectric layer 403a corresponding to the side face of the top trench 406, so that the opening 406a is expanded into an opening 406b;

Step 33: as shown in FIG. 4D, secondary polysilicon dry-etching is carried out, and the first polysilicon layer 404 subjected to the secondary polysilicon dry-etching is used as shielding polysilicon 404, wherein the top surface of the shielding polysilicon 404 is as large as the bottom surface of the top trench 406 to be formed, and the opening 406b is expanded into an opening 406c;

The secondary polysilicon dry-etching is isotropic etching, which is carried out to further decrease the thickness of the rest of the first dielectric layer 403 corresponding to the side face of the top trench 406 before Step 34;

Step 34: as shown in FIG. 4E, secondary dielectric layer wet-etching is carried out to remove the rest of the first dielectric layer 403 corresponding to the side face of the top trench 406 and to form the top trench 406, and the first dielectric layer 403 subjected to the secondary dielectric layer wet-etching is used as a shielding dielectric layer 403, wherein the top surface of the shielding dielectric layer 403 is lower than the top surface of the shielding polysilicon 404, as shown in dashed box 406d in FIG. 4E; before the competition of the secondary polysilicon dry-etching, the thickness of the rest of the first dielectric layer 403 corresponding to the side face of the top trench 406 is decreased to shorten the time for the secondary dielectric layer wet-etching, so that a height difference between the top surface of the shielding dielectric layer 403 and the top surface of the shielding polysilicon 404 is reduced;

Step 4: a trench gate is formed in the top trench 406 through the following steps:

Step 41: as shown in FIG. 4G, a gate dielectric layer 407 and an inter-gate dielectric layer 407a are formed, wherein the gate dielectric layer 407 is located on the side face of the top trench 406, and the inter-gate dielectric layer 407a covers the side face and top surface of the shielding polysilicon located 404 over the top surface of the shielding dielectric layer 403;

In this embodiment, the gate dielectric layer 407 is an oxide layer, and the inter-layer dielectric layer 407a is an oxide layer;

The gate dielectric layer 407 and the inter-gate dielectric layer 407a are synchronously formed by the same thermal oxidization process;

Step 42: as shown in FIG. 4H, the top trench 406 is filled with a gate conducting material layer 408, and the gate conducting material layer is superimposed on the gate dielectric layer 407 to form the trench gate, wherein the inter-gate dielectric layer 407a is used for isolating the gate conducting material layer 408 from the shielding polysilicon 404;

The gate conducting material layer 408 is a polysilicon gate formed by a second polysilicon layer.

Figure 4I:
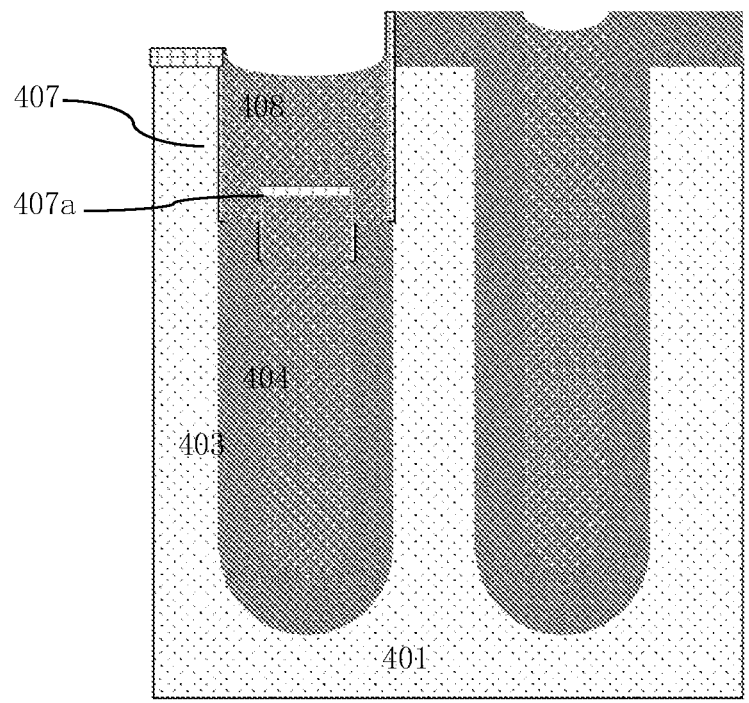

The polysilicon gate 408 is formed through the following steps:

As shown in FIG. 4H, the second polysilicon layer 408 is formed by deposition, wherein the top trench 406 is fully filled with the second polysilicon layer 408 which extends to the outer surface of the top trench 406;

As shown in FIG. 4I, polysilicon back-etching is carried out to remove the second polysilicon layer 408 on the outer surface of the top trench 406, and the polysilicon gate 408 is formed by the second polysilicon layer 408 left in the top trench 406.

In this embodiment, the gate trench 402 formed in Step 1 is located in a device region of the trench gate device, and a source lead-out region is located outside the device region.

As shown in FIG. 4A, a source lead-out trench 402a is formed in the source lead-out region, the source lead-out trench 402a and the gate trench 402 are synchronously formed by the same process, and the source lead-out trench 402a is communicated with the gate trench 402.

In Step 2, the first dielectric layer 403 and the first polysilicon layer 404 are also synchronously formed in the source lead-out trench 402a.

In step 3, a first photoresist pattern 405 is defined by lithography before the top trench 406 is formed, and the first photoresist pattern 405 opens the device region, covers the source lead-out region and is removed after the top trench 406 is formed and before Step 4 is performed, as shown in FIG. 4F.

The trench gate device comprises a plurality of device cell structures which are periodically arrayed in the device region. A plurality of gate trenches 402 are formed in Step 1, and each gate trench corresponds to one device cell structure.

The lightly-doped first epitaxial layer 401 provided in Step 1 is of a first conductivity type, is formed in a drift region of the trench gate device, and is located on the surface of a heavily-doped semiconductor substrate of the first conductivity type.

The semiconductor substrate is a silicon substrate, and the first epitaxial layer 401 is a silicon epitaxial layer.

Figure 4J:
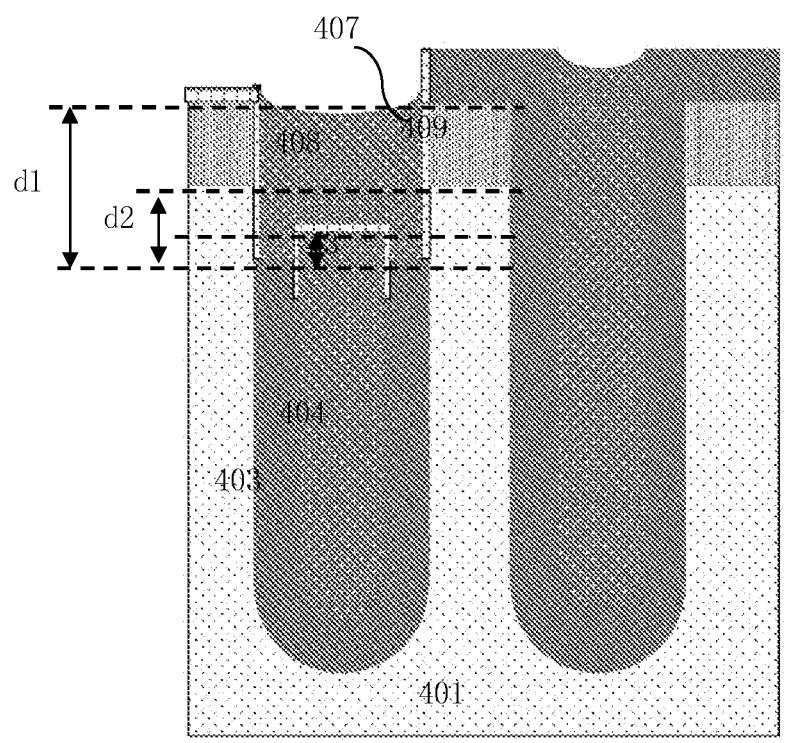

The manufacturing method further comprises the following steps to be performed after Step 4:

As shown in FIG. 4J, a well region 409 of a second conductivity type is formed in the first epitaxial layer 401, wherein the trench gate penetrates through the well region 409, covers a side face of the well region 409, and forms a channel on the side face of the well region 409;

First conductivity-type heavily-doped implantation is carried out to form a source region on the surface of the well region 409 of the second conductivity type;

An interlayer film is formed on the front side of the semiconductor substrate;

Contact holes penetrating through the interlayer film are formed by etching and an etching area defined by lithography, wherein the contact holes are correspondingly formed in the top of the first polysilicon layer 404 located in the source region, the trench gate and the source lead-out trench 402a;

A front metal layer is formed and is patterned to form a source and a gate, wherein the source is connected with the source region at the bottom of the source via the corresponding contact hole, the gate is connected with the polysilicon gate at the bottom of the gate via the corresponding contact hole, the source is also connected with the first polysilicon layer 404 in the source lead-out trench 402a at the bottom of the source via the corresponding contact holes, and the shielding polysilicon 404 is connected to the source via the first polysilicon layer 404 in the source lead-out trench 402a.

The trench gate device is a trench gate MOSFET, and the manufacturing method further comprises the following steps:

The semiconductor substrate is thinned from the back side;

A heavily-doped drain region of the first conductivity type is formed on the back side of the thinned semiconductor substrate;

A back metal layer is formed on the back side of the drain region, and a drain is formed by the back metal layer.

In this embodiment, the trench gate device is an N-type device, the first conductivity type is an N type, and the second conductivity type is a P type. Or, in other embodiments, the trench gate device is a P-type device, the first conductivity type is a P type, and the second conductivity type is an N type.

In this embodiment, after the gate trench 402 is fully filled with the first dielectric layer 403 and the first polysilicon layer 404, the first polysilicon layer 404 is etched step by step in the process of forming the top trench 406 corresponding to the trench gate by etching, and wet-etching of the first dielectric layer 403 is carried out between the two times of polysilicon dry-etching, so that the thickness of the rest of the first dielectric layer 403 corresponding to the side face of the top trench 406 is decreased before the completion of secondary polysilicon dry-etching, the time for the secondary dielectric layer wet-etching for completely removing the first dielectric layer 403 is shortened, and the height difference between the top surface of the shielding dielectric layer 403 and the top surface of the shielding polysilicon 404 is decreased. In this way, the gate-source overlap area and the gate-drain overlap area are reduced, the gate-source capacitance and the gate-drain capacitance are decreased to decrease the input capacitance, and accordingly, the switching delay time of the device is shortened, and the switching rate is increased.

As can be seen from FIG. 4J, the height of an area covered by the side face of the polysilicon gate 408 is d1, a gate-drain overlap area having a height of d2 is formed between the bottom of the well region 409 and the bottom surface of the polysilicon gate 408, and a gate-source overlap area having a height of d3 is formed between the top surface of the shielding polysilicon 404 and the bottom surface of the polysilicon gate 408.

By adoption of the method in this embodiment, the height corresponding to the area marked as 406d in FIG. 4E is reduced, d2 and d3 are reduced, the gate-drain capacitance Cgd is decreased with the reduction of d2, and the gate-source capacitance Cgs is decreased with the reduction of d3.

An SEM detection result shows that d2 obtained by the method in this embodiment is smaller than d102 obtained by the existing method, and d3 obtained by the method in this embodiment is smaller than d103 obtained by the existing method. Therefore, a device manufactured through the method in this embodiment can decrease the gate-drain capacitance Cgd and the gate-source capacitance Cgs, thereby being capable of decreasing the input capacitance.

The invention is expounded with reference to the above embodiments, but these embodiments are not intended to limit the invention. Various transformations and improvements can be made by those skilled in the art without deviating from the principle of the invention, and all these transformations and improvements should also fall within the protection scope of the invention.

What is claimed is:

1. A manufacturing method for a shielded gate trench device, comprising the following steps:

Step 1: providing a first epitaxial layer, and forming a gate trench in a gate formation area of the first epitaxial layer by etching and an etching area defined by lithography;

Step 2: forming a first dielectric layer on a bottom surface and a side wall surface of the gate trench, wherein the first dielectric layer extends to an outer surface of the gate trench;

Fully filling the gate trench, formed with the first dielectric layer, with a first polysilicon layer, wherein a surface of the first polysilicon layer is flush with a surface of the first dielectric layer located outside the gate trench;

Step 3: etching the first polysilicon layer and the first dielectric layer at a top of the gate trench to form a top trench, by performing the following steps:

Step 31: carrying out primary polysilicon dry-etching, wherein after the primary polysilicon dry-etching, a top surface of the first polysilicon layer is higher than a bottom surface of the top trench to be formed;

Step 32: carrying out primary dielectric layer wet-etching to decrease a thickness of the first dielectric layer corresponding to a side face of the top trench;

Step 33: carrying out secondary polysilicon dry-etching, and using the first polysilicon layer subjected to the secondary polysilicon dry-etching as shielding polysilicon, wherein a top surface of the shielding polysilicon is as large as the bottom surface of the top trench to be formed;

Step 34: carrying out secondary dielectric layer wet-etching to remove the rest of the first dielectric layer corresponding to the side face of the top trench, and using the first dielectric layer subjected to the secondary dielectric layer wet-etching as a shielding dielectric layer, wherein a top surface of the shielding dielectric layer is lower than the top surface of the shielding polysilicon; before the completion of the secondary polysilicon dry-etching, the thickness of the rest of the first dielectric layer corresponding to the side face of the top trench is decreased to shorten the time for the secondary dielectric layer wet-etching, so that a height difference between the top surface of the shielding dielectric layer and the top surface of the shielding polysilicon is reduced; and Step 4: forming a trench gate in the top trench.

2. The manufacturing method for the shielded gate trench device according to claim 1, wherein the first dielectric layer is an oxide layer.

3. The manufacturing method for the shielded gate trench device according to claim 2, wherein the primary polysilicon dry-etching is isotropic etching, which is carried out to further decrease the thickness of the rest of the first dielectric layer corresponding to the side face of the top trench before Step 34 is performed.

4. The manufacturing method for the shielded gate trench device according to claim 3, wherein the secondary polysilicon dry-etching is isotropic etching, which is carried out to further decrease the thickness of the rest of the first dielectric layer corresponding to the side face of the top trench before Step 34 is performed.

5. The manufacturing method for the shielded gate trench device according to claim 1, wherein Step 4 comprises the following steps:

Step 41: forming a gate dielectric layer and an inter-gate dielectric layer, wherein the gate dielectric layer is located on the side face of the top trench, and the inter-gate dielectric layer covers a side face and the top surface of the shielding polysilicon located over the top surface of the shielding dielectric layer; and Step 42: filling the top trench with a gate conducting material layer, and superimposing the gate conducting material layer on the gate dielectric layer to form the trench gate, wherein the inter-gate dielectric layer is used for isolating the gate conducting material layer from the shielding polysilicon.

6. The manufacturing method for the shielded gate trench device according to claim 5, wherein the gate dielectric layer is an oxide layer and is formed by a thermal oxidization process.

7. The manufacturing method for the shielded gate trench device according to claim 6, wherein the inter-gate dielectric layer is an oxide layer.

8. The manufacturing method for the shielded gate trench device according to claim 7, wherein the gate dielectric layer and the inter-gate dielectric layer are synchronously formed by a same thermal oxidization process.

9. The manufacturing method for the shielded gate trench device according to claim 5, wherein the gate conducting material layer is a polysilicon gate formed by a second polysilicon layer.

10. The manufacturing method for the shielded gate trench device according to claim 1, wherein the gate trench formed in Step 1 is located in a device region of the trench gate device, and a source lead-out region is located outside the device region;

A source lead-out trench is formed in the source lead-out region, the source lead-out trench and the gate trench are synchronously formed by a same process, and the source lead-out trench is communicated with the gate trench;

In Step 2, the first dielectric layer and the first polysilicon layer are also synchronously formed in the source lead-out trench;

In Step 3, a first photoresist pattern is defined by lithography before the top trench is formed, wherein first photoresist pattern opens the device region, closes the source lead-out region and is removed after the top trench is formed and before Step 4 is performed.

11. The manufacturing method for the shielded gate trench device according to claim 10, wherein the trench gate device comprises a plurality of device cell structures which are periodically arrayed in the device region; and a plurality of said gate trenches are formed in Step 1, and each said gate trench corresponds to one device cell structure.

12. The manufacturing method for the shielded gate trench device according to claim 11, wherein the lightly-doped first epitaxial layer provided in Step 1 is of a first conductivity type, is formed in a drift region of the trench gate device, and is located on a surface of a heavily-doped semiconductor substrate of the first conductivity type.

13. The manufacturing method for a shielded gate trench device according to claim 12, wherein the semiconductor substrate is a silicon substrate, and the first epitaxial layer is a silicon epitaxial layer.

14. The manufacturing method for the shielded gate trench device according to claim 13, wherein the manufacturing method further comprises the following steps to be performed after Step 4:

Forming a well region of a second conductivity type in the first epitaxial layer, wherein the trench gate penetrates through the well region, covers a side face of the well region, and forms a channel on the side face of the well region;

Carrying out first conductivity-type heavily-doped implantation to form a source region on a surface of the well region of the second conductivity type;

Forming an interlayer film on a front side of the semiconductor substrate;

Forming contact holes penetrating through the interlayer film by etching and an etching area defined by lithography, wherein the contact holes are correspondingly formed in a top of the first polysilicon layer located in the source region, the trench gate and the source lead-out trench; and Forming a front metal layer, and patterning the front metal layer to form a source and a gate, wherein the source is connected with the source region at a bottom of the source via the corresponding contact holes, the gate is connected with the polysilicon gate at a bottom of the gate via the corresponding contact hole, the source is also connected with the first polysilicon layer in the source lead-out region at a bottom of the source via the corresponding contact hole, and the shielding polysilicon is connected to the source via the first polysilicon layer in the source lead-out trench.

15. The manufacturing method for the shielded gate trench device according to claim 14, wherein the trench gate device is a trench gate MOSFET, and the manufacturing method further comprises the following steps:

Thinning the semiconductor substrate from a back side;

Forming a heavily-doped drain region of the first conductivity type on the back side of the thinned semiconductor substrate; and Forming a back metal layer on a back side of the drain region, and forming a drain by the back metal layer.

\* \* \* \* \*